United States Patent [19]
Zukowski et al.

[11] Patent Number: 5,366,584
[45] Date of Patent: Nov. 22, 1994

[54] REMOVING UNCURED EMULSION FROM STENCILS DURING PHOTOMASK PRODUCTION

[75] Inventors: Raymond L. Zukowski; Randy S. Willis, both of Vista, Calif.

[73] Assignee: Rayzist Photomask, Inc., Vista, Calif.

[21] Appl. No.: 44,063

[22] Filed: Apr. 6, 1993

Related U.S. Application Data

[63] Continuation-in-part of Ser. No. 833,848, Feb. 11, 1992.

[51] Int. Cl.$^5$ .............................................. B32B 31/00
[52] U.S. Cl. ..................................... 156/642; 430/269; 430/308; 239/127; 156/905; 156/272.4
[58] Field of Search ................... 156/642, 905, 272.4; 430/269, 308; 239/124–127

[56] References Cited

U.S. PATENT DOCUMENTS

| | | | |
|---|---|---|---|
| 3,915,832 | 10/1975 | Rackus et al. | 205/151 |
| 4,004,782 | 1/1977 | Jeppsen | 259/3 |
| 4,253,910 | 3/1981 | Mason et al. | 430/308 |
| 4,720,330 | 1/1988 | Shabrang et al. | 205/143 |
| 4,985,111 | 1/1991 | Ketelhohn | 156/642 |

*Primary Examiner*—Chester T. Barry
*Attorney, Agent, or Firm*—Nixon & Vanderhye

[57] ABSTRACT

Uncured emulsion is effectively washed from a stencil in the production of photomasks by mounting a drum rotatable about a horizontal axis within a portable cabinet. The drum is driven by a small (e.g. variable speed 1/16 HP) electric motor and spins at about 50–100 rpm. Water is sprayed onto the stencil mounted on the drum at about 80 psi by 4–10 V-jet nozzles. Liquid running off the stencil is collected by a catch basin mounted just below the drum, and passes through a drain pipe with strainer into a heat insulated holding tank with an electric resistance heating element, and is recirculated from the tank to the spray nozzles by a high pressure pump. The pump and motor are controlled by a timer, and after completion of the washing cycle the stencil is removed from the cabinet.

17 Claims, 2 Drawing Sheets

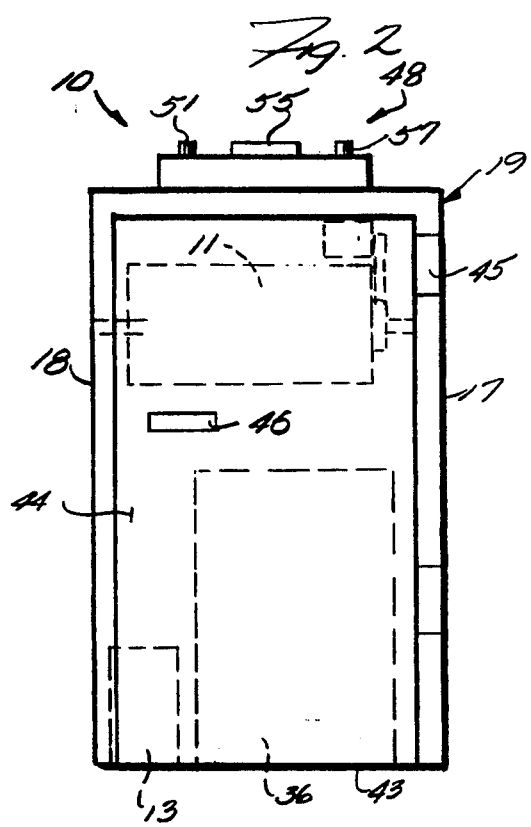
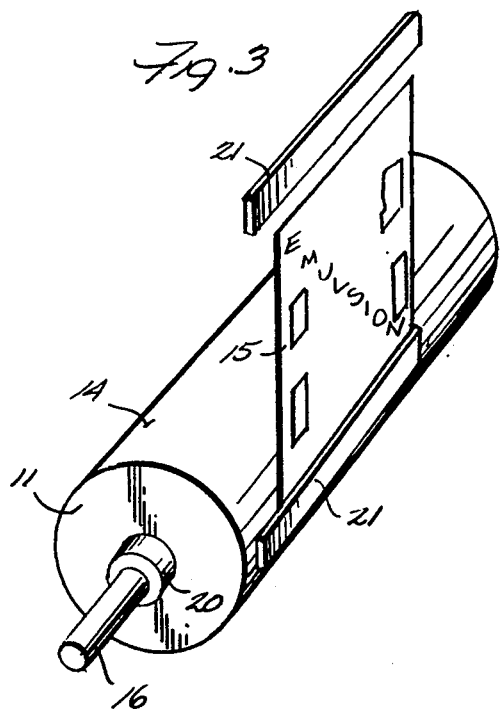
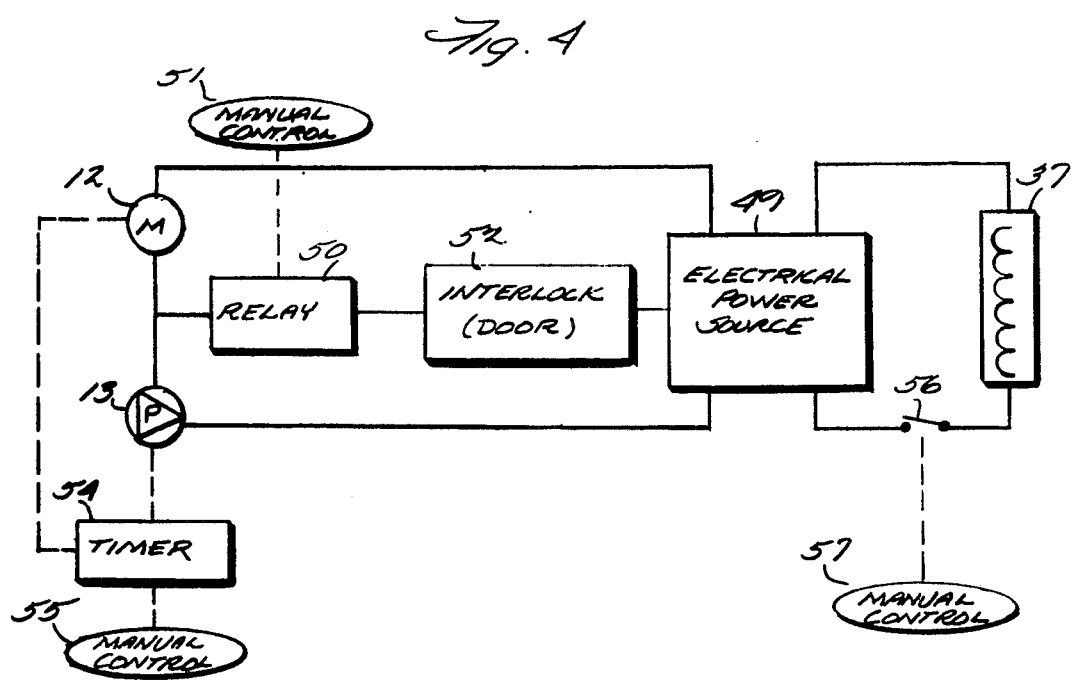

REMOVING UNCURED EMULSION FROM STENCILS DURING PHOTOMASK PRODUCTION

CROSS REFERENCE TO RELATED APPLICATION

This application is a continuation-in-part of application Ser. No. 07/833,848 filed Feb. 11, 1992, the disclosure of which is hereby incorporated by reference herein.

BACKGROUND AND SUMMARY OF THE INVENTION

In the parent application, a method and apparatus are described for a simple and relatively inexpensive, practical production of photomasks for sandblast engraving or sand carving directly at a user's site. While the structure and method described therein is very effective, it is desirable to be able to effect washing of the uncured emulsion from the stencil utilizing equipment that is somewhat more efficient and/or effective than the open tank with reciprocating spray heads described in the parent application. Heretofore, it has not been considered feasible to utilize a spinning drum washout system utilizing the sophisticated and relatively expensive equipment described in the prior art section of the parent application directly at a use site. However according to the present invention it is possible to produce a relatively simple and inexpensive, yet effective and efficient, spin processor for washing uncured emulsion from a stencil directly at a user's site.

The basic apparatus according to the present invention includes a drum that is mounted for rotation about a horizontal axis, and is driven (e.g. belt driven) with a small electric motor at a relatively slow angular speed (e.g. 50–100 rpm). A high pressure pump is mounted within the same portable cabinet as the drum and motor, and is operated at the same time as the motor to direct liquid (primarily water) through 4–10 V-jet nozzles to provide uniform water distribution over the stencil, and the sprayed water is effectively and simply recycled utilizing a catch basin, a heat insulated holding tank with electrical heating element, and the like.

According to one aspect of the present invention, an apparatus for removing uncured emulsion from a stencil in the production of photomasks is provided. The apparatus comprises the following elements: A drum having an exterior surface for receipt of a stencil thereon. Means for holding a stencil onto the drum exterior surface. Means for mounting the drum for rotation about an axis. An approximately 1/32 to ⅛ horsepower electrical motor for rotating the drum about its axis of rotation. Means for directing streams of high pressure liquid at sufficient temperature, and with sufficient force, and for a sufficient period of time, against a stencil mounted on the drum and rotating therewith to remove uncured emulsion from the stencil. And, control means for controlling operation of the motor.

The apparatus typically further comprises a portable cabinet containing a drum, means mounting the drum for rotation about a horizontal axis, and liquid stream directing means, with an access door being provided to the cabinet (which may be interlocked with the control means). The means for directing streams of liquid typically comprises a high pressure pump (e.g. for pressurizing the liquid to about 80 psi), a plurality of V-jet nozzles, means for collecting liquid running off a stencil mounted on the drum, and conduit means connecting the pump, nozzles, and collecting means for recirculating liquid. The collecting means typically comprises a catch basin mounted below the drum and having a drain therein, and a heat insulated holding tank connected to the drain into the conduit means. An electrical heating element is typically provided in the holding tank for heating collected liquid to an appropriate temperature above ambient (e.g. typically at least about 90° F.). The drain may include a drain pipe having a strainer mounted therein.

Typically the control means controls operation of the motor and substantially simultaneous operation of the pump, and includes a timer and an on/off switch. Most preferably the motor comprises an AC or AC/DC variable speed 1/16 HP motor with a carriage type mounting.

The drum exterior surface is typically of a ferromagnetic material (e.g. galvanized steel) and the stencil holding means comprises a plurality of (e.g. two) magnetic strips, which are on the opposite side of the stencil from the drum. The V-jet nozzles preferably produce flat spray patterns, with uniform water distribution and tapered edges so that the water distribution is uniform even where the spray patterns overlap, and typically 4 to 10 nozzles are provided depending upon the size of the unit. The pump typically comprises an about ¼–½ HP regenerative turbine pump.

According to another aspect of the present invention apparatus for removing uncured emulsion from a stencil in the production of photomasks comprises the following elements: A drum having an exterior surface for receipt of a stencil thereon. Means for holding a stencil onto the drum exterior surface. Means for mounting the drum for rotation about an axis. Means for rotating the drum about its axis of rotation at an angular speed between about 50–100 rpm. Means for directing streams of high pressure liquid at sufficient temperature, and with sufficient force, and for a sufficient period of time, against a stencil mounted on the drum and rotating therewith to remove uncured emulsion from the stencil; the means comprising: a high pressure pump; a plurality of V-jet nozzles; means for collecting liquid running off a stencil mounted on the drum; and conduit means connecting the pump, nozzles, and collecting means for recirculating liquid. And, control means for controlling operation of the motor and the pump.

The invention also contemplates a method of making a photomask having a carrier sheet covered with a cured design structure from a stencil (which itself comprises a carrier sheet with a curable emulsion coating). The method is basically the same as that described in the parent application except for the manner of washing. The method comprises the steps of substantially sequentially: (a) Clamping a stencil in face-to-face contact with a print positive sheet having design elements, the stencil emulsion coating contacting the print positive. (b) Exposing the clamped stencil and print positive to emulsion curing radiation, to cure the emulsion except for areas covered by design elements of the print positive. (c) Separating the stencil from the print positive. (d) Mounting the stencil on the exterior surface of a drum rotatable about a horizontal axis of rotation. (e) Rotating the drum about its axis at an angular speed of between about 50–100 rpm. (f) While the drum is rotating, directing a spray pattern of liquid comprising primarily water, at a temperature of at least about 90° F., at a pressure of roughly about 80 psi, to remove uncured emulsion from the stencil. (g) Catching the liquid sprayed onto the stencil, and recirculating it to a holding tank to be reused as spray liquid in step (f). (h) After steps (e) and (f) have been practiced a sufficient length of time to remove substantially all uncured emulsion, taking the stencil off of the drum. (i) Manually blotting the stencil. (j) Drying the stencil. And, (k) manually applying adhesive to the cured emulsion coating face of the stencil, to produce a photomask. Step (f) is typically practiced to provide 4–10 flat spray patterns with uniform liquid distribution and tapered edges so as to provide uniformity where the spray patterns overlap, and step (g) is further practiced by heating liquid in the holding tank, and heat insulating the tank.

It is the primary object of the present invention to provide a simple, yet efficient and effective, apparatus for washing stencils directly at a user's site during the production of photomasks, and a method of producing such photomasks utilizing an apparatus. This and other objects of the invention will become clear from an inspection of the detailed description of the invention and from the appended claims.

BRIEF DESCRIPTION OF THE DRAWINGS

FIG. 2 is a front elevational view of the apparatus of FIG. 1 showing the cabinet door closed, and indicating in dotted line some of the components mounted within it;

FIG. 3 is a detail perspective view of the drum of the apparatus of FIG. 1 showing a stencil being mounted thereon for processing in accordance with the method of the present invention; and FIG. 4 is an electrical control schematic illustrating the interconnections between the various components of the apparatus of FIG. 1.

DETAILED DESCRIPTION OF THE DRAWINGS

Figure 1:
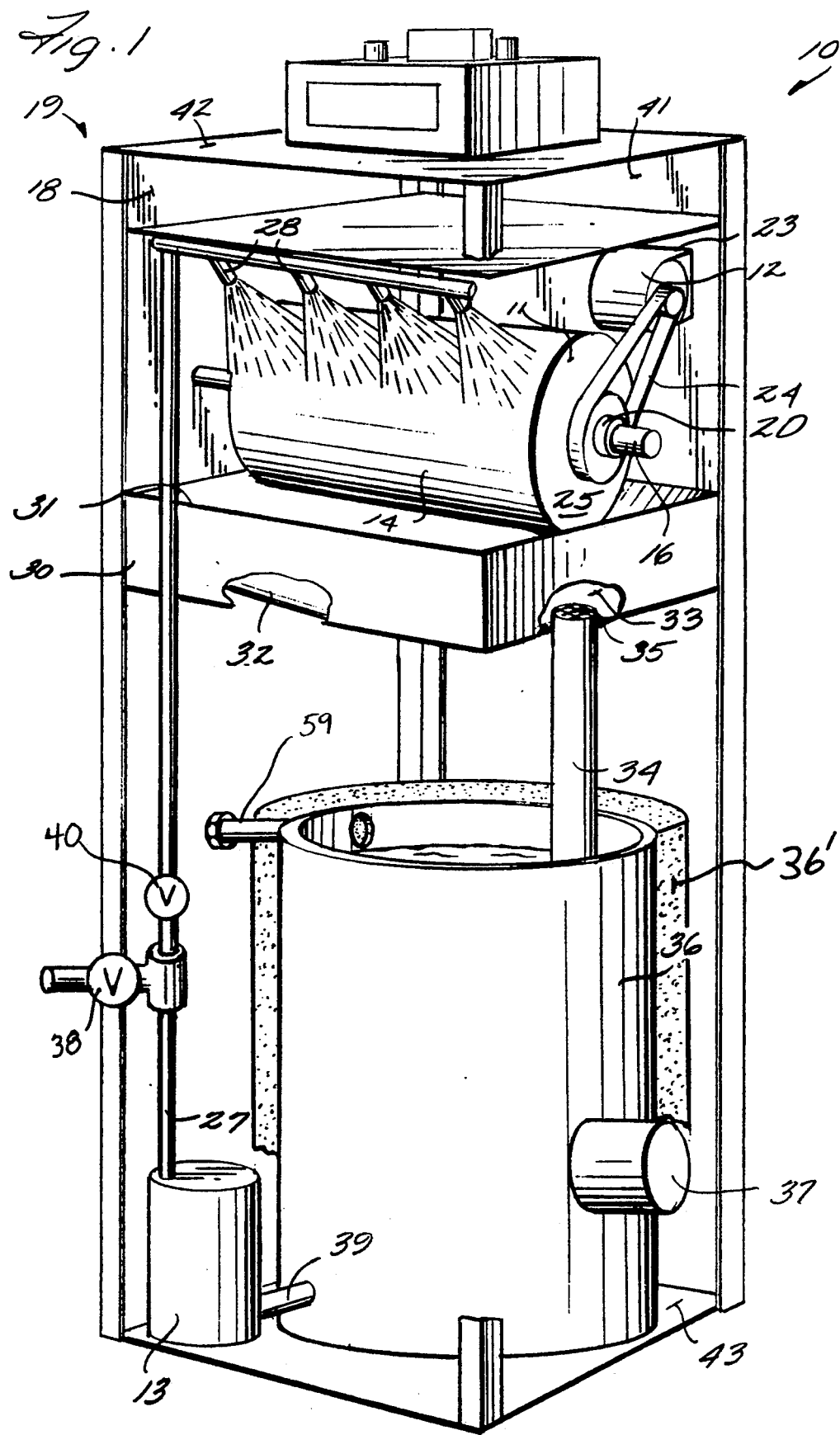
FIG. 1 is a schematic perspective view, with two sides of the cabinet cut away for clarity of illustration, of an exemplary apparatus (spin processor) according to the present invention.

An exemplary apparatus for removing uncured emulsion from a stencil in the production of photomasks is shown generally by reference numeral 10 in FIG. 1. The apparatus illustrated in FIG. 1 is intended to be used in place of the open tank with reciprocating spray heads wash-out unit illustrated and described in the parent application. The apparatus of FIG. 1, which may be generically referred to as a spin processor, is simple and inexpensive and small enough to be portable and used directly at a user's site (that is the site of use of a photomask for sandblasting or sand carving), and readily moved to different locations within the user's site, yet it effectively and efficiently and reliably washes substantially all of the uncured emulsion from the stencil.

The apparatus 10 includes as the most basic components thereof the drum 11, electrical motor 12, and high pressure pump 13.

The drum 11 has an exterior surface 14 (see FIGS. 1 and 3) for receipt of a stencil (carrier sheet with a curable emulsion coating) 15 (see FIG. 3) thereon. Preferably at least the exterior surface 14 of the drum is a ferromagnetic material, typically galvanized steel. The drum 11 is mounted for rotation about an axis—preferably a substantially horizontal axis—by suitable means, such as the shaft 16. The shaft 16 may be stationary, mounted in opposite walls 17, 18 of a cabinet 19, which contains all of the spin processor components. Bearings 20 are provided at opposite ends of the drum 11 for receipt of the shaft 16 and allowing rotation of the drum exterior surface 14 with respect to the shaft 16.

The stencil 15 is held to the exterior surface 14 of the drum 11, emulsion side out, with a suitable holding means, such as two or more magnetic strips 21. The magnetic strips 21 typically are flexible magnetic material, such as utilized on bathroom doors, and are about one inch wide and conform fairly well to the surface 14. They have insufficient weight to cause destructive imbalance of the drum 11 when rotating about the axis defined by shaft 16 even if closely spaced.

The electrical motor 12 rotates the drum 11 about the axis defined by the shaft 16, preferably between about 50–100 rpm. The electrical motor 12 is small, an approximately 1/32 to ⅛ horsepower motor, and most preferably a 1/16 HP AC or AC/DC variable speed motor, provided on a carriage type mount—see 23 in FIG. 1—such as a standard forty-eight frame cradle mount. The drum 11 is preferably driven by the motor 12 by a belt drive 24, connected between the output shaft from the motor 12 and a pulley 25 integral with the drum 11.

The high pressure pump 13 is part of a system for spraying water onto a stencil 15 mounted on the drum 11 as it is being rotated, and for recirculating the water. The pump 13 is typically between about ¼–½ HP, more typically a ⅓ HP or ½ HP regenerative turbine pump. For example it may be a type of pump manufactured by Bunks Pump powered by a 120 volt AC source, and having a capacity of about 4.3 gallons per minute for the ⅓ HP unit, and about 8.3 gpm for the ½ HP unit.

The pump 13 is connected by a conduit 27 to a plurality of spray nozzles (typically 4–10 nozzles depending upon the size of the apparatus 10) 28 mounted just above, and to the side, of the drum 11. The nozzles 28 preferably are V-jet nozzles, such as type H-VV. These nozzles produce a flat spray pattern with uniform water distribution and tapered edges. The taper at the edges provides uniformity of spray where the spray patterns from the nozzles 28 overlap. Each of the nozzles 28 is preferably of a one piece construction with no internal vanes.

Means are also provided for collecting liquid—delivered by the pump 13, conduit 27, and spray nozzles 28 —coming off the stencil 15 for recirculating the liquid (primarily water) used to remove the emulsion. Such collecting means preferably includes a catch basin 30 having an open top and mounted with respect to the drum 11 so that some rotating peripheral portions of the drum 11 are within the volume defined by the catch basin 30, being slightly below the upper lip 31 of the catch basin 30 as illustrated in FIG. 1. The catch basin 30 has closed sidewalls, and a floor 32 (see FIG. 1) which slopes downwardly from one end of the catch basin toward the end with the drain 33. The drain 33 is connected to a drain pipe 34, and a simple water strainer 35 is provided at the drain 33 (see FIG. 1), or in the drain pipe 34.

The drain pipe 34 discharges recirculated water into the hot water holding tank 36, heat insulated by outer jacket 36' (shown cut away in FIG. 1). The water tank 36 preferably has an electric resistance heating element 37 therein which heats the water in the tank 36 so that it has a temperature of about 90° F. The tank 36 may have a drain valve 38 associated therewith. The tank 36 is also connected by a conduit 39 to the regenerative turbine pump 13. The drain valve 38 is preferably placed in a T connected to conduit 27 downstream of the pump 13 so that water can be pumped from the tank 36 to any desired disposal site. Valve 40 is opened when valve 38 is closed, and vice versa. The valves 38, 40 may be manually activated.

The cabinet 19, in addition to comprising two solid sidewalls 17, a solid back wall 41 (see FIG. 1), and solid top and bottom 42, 43, respectively, has an access door 44 (see FIG. 2) in the front thereof connected by hinges 45 to the sidewall 17 or the like, and having a handle 46 which controls a conventional latch mechanism (not shown). Also, typically mounted on top 42 of the portable cabinet 19 is a control panel 48 (see FIG. 2), which has various switches and controls for controlling the components illustrated in FIG. 4.

In the electrical schematic of FIG. 4, the motor 12 and pump 13 are shown connected to an electrical power source 49 (e.g. a 120 volt AC source) through a switch or relay 50, which may be controlled by the manual control 51 which is part of the control panel 44. Also an automatic interlock 52 of conventional design may be provided associated with the latch mechanism of the access door 44 to make sure that the door 44 is closed before the unit 10 will operate.

A timer—shown schematically at 54 in FIG. 4—preferably is also provided for controlling the motor 12 and pump 13 (which typically are controlled substantially simultaneously). The timer 54 may be of any suitable conventional type, such as an OMRON variable timer. A manual control 55—also associated with the control panel 48—may be provided for setting the time of operation of the motor 12 and pump 13 (which are typically run about one to five minutes, e.g. three minutes to wash all of the uncured emulsion off the stencil 15).

FIG. 4 also illustrates a switch 56, having a manual control 57 (also on the control panel 48) associated therewith, for either connecting or disconnecting the heating element 37 to the power source 49.

In an exemplary utilization of the apparatus 10 according to the present invention in a method of making a photomask, first the stencil 15 is clamped in face-to-face contact with a print positive sheet having design elements, the stencil emulsion coating contacting the print positive, as described in the parent application. Then the clamped stencil and print positive are exposed to emulsion curing radiation to cure the emulsion except for areas covered by design elements. The stencil 15 is then mounted on the exterior surface 14 of the drum 11 rotatable about the horizontal axis defined by shaft 16, utilizing the magnetic strips 21. Then the door 44 is closed, and the timer 54 is set with the manual control 55, and the switch or relay 50 operated so as to start the motor 12 and pump 13. The motor 12 rotates the drum 11 about its axis at an angular speed of between about 50–100 rpm.

While the drum 11 is rotating, a spray pattern of water at a temperature of at least about 90° F (heated by the heating element 37 in the tank 36) and a pressure of roughly about 80 psi (provided by the pump 13) impacts the stencil 15 on the rotating drum 11. The spray is provided by 4–10 spray nozzles 28 which provide flat spray patterns with uniform liquid distribution and tapered edges so as to provide uniformity where the spray patterns overlap. The liquid that sprays onto the stencil 15 and washes off the uncured emulsion is caught by the catch basin 30, passes through drain 33 and strainer 35 into the tank 36, and then is recirculated through conduit 39, pump 13, and conduit 27 back to the spray nozzles 28. The recirculation and spraying of the liquid is practiced a sufficient length of time (e.g. about one to five minutes (controlled by timer 54)) to remove substantially all of the uncured emulsion from the stencil 15. Then the door 44 is opened using the handle 46, and the stencil 15 removed from the drum 11.

As described in the parent application, after the stencil 15 is removed from the cabinet 19, it is manually blotted, dried (as in a microwave), and adhesive is manually applied to the cured emulsion coating face of the stencil, to produce a photomask. The photomask is then used directly at the use site for sandblasting or sand carving, in a conventional manner.

The water used in the apparatus 10, held by the tank 36 at the end of each use, is preferably changed weekly (or as needed) by pumping it out through the drain valve 38, and then closing the bottom drain valve 38 and introducing new liquid into the open top of the tank 36, or if the tank has a closed insulated top (not shown), fresh water is introduced through inlet 59. The tank 36 may be flushed to clean it.

It will thus be seen that according to the present invention a simple yet efficient and effective apparatus has been provided for removing uncured emulsion from a stencil. While the invention has been herein shown and described in what is presently conceived to be the most practical and preferred embodiment it will be apparent to those of ordinary skill in the art that many modifications may be made thereof within the scope of the invention, which scope is to be accorded the broadest interpretation of the appended claims so as to encompass all equivalent structures and methods.

What is claimed is:

1. Apparatus for removing uncured emulsion from a stencil in the production of photomasks, comprising:
   a drum having an exterior surface for receipt of a stencil thereon;
   means for holding a stencil onto said drum exterior surface;
   means for mounting said drum for rotation about an axis;
   a nominal 1/32 to ⅛ horsepower electrical motor for rotating said drum about its axis of rotation;
   means for directing streams of high pressure liquid at sufficient temperature, and with sufficient force, and for a sufficient period of time, against a stencil mounted on said drum and rotating therewith to remove uncured emulsion from the stencil;
   control means for controlling operation of said motor;
   a portable cabinet containing said drum, said means for mounting said drum for rotation, and said means for directing streams of liquid; and an access door to said cabinet;
   means for collecting liquid running off a stencil mounted on said drum; and
   conduit means for connecting said pump, nozzles, and collecting means for recirculating liquid.

2. Apparatus as recited in claim 1 wherein said means for collecting liquid running off a stencil mounted on said drum comprises a catch bin, mounted below said drum and having a drain therein; and
   wherein said means for mounting said drum for rotation comprises means for mounting said drum for rotation about a substantially horizontal axis that the rotating peripheral portion of said drum is within the volume defined by said catch basin.

3. Apparatus as recited in claim 1 wherein said means for directing streams of liquid comprises: a high pressure pump; and a plurality of V-jet nozzles.

4. Apparatus as recited in claim 3 further comprising electrical heating means for heating collected liquid to an appropriate temperature above ambient.

5. Apparatus as recited in claim 4 wherein said collecting means comprises a catch basin mounted below said drum having a drain therein, and a heat insulated holding tank connected to said drain and to said conduit means.

6. Apparatus as recited in claim 5 wherein said control means for controlling operation of said motor also substantially simultaneously controls operation of said pump; and wherein said pump comprises an about $\frac{1}{4}-\frac{1}{2}$ HP regenerative turbine pump capable of producing roughly about 80 psi.

7. Apparatus as recited in claim 5 wherein said means for mounting said drum for rotation comprises means for mounting said drum for rotation about a substantially horizontal axis so that a rotating peripheral portion of said drum is within the volume defined by said catch basin.

8. Apparatus as recited in claim 5 wherein said drain includes a drain pipe, and a strainer.

9. Apparatus as recited in claim 5 further comprising means for pumping liquid from said tank and for introducing fresh liquid into said tank.

10. Apparatus as recited in claim 3 wherein said V-jet nozzles produce flat spray patterns with uniform water distribution and tapered edges where the patterns overlap, and wherein 4–10 nozzles are provided.

11. Apparatus as recited in claim 1 wherein said drum exterior surface is of ferromagnetic material, and wherein said stencil holding means comprises a plurality of magnetic strips.

12. Apparatus as recited in claim 1 wherein said control means comprises a control switch and a timer, and wherein said electrical motor comprises a 1/16 HP motor.

13. Apparatus for removing uncured emulsion from a stencil in the production of photomasks, comprising:

a drum having an exterior surface for receipt of a stencil therein;

means for holding a stencil onto said drum exterior surface;

means for mounting said drum for rotation about an axis;

means for rotating said drum about its axis of rotation at an angular speed between about 50–100 rpm;

means for directing streams of high pressure liquid at sufficient temperature, and with sufficient force, for a sufficient period of time, against a stencil mounted on said drum and rotating therewith to remove uncured emulsion from the stencil; said means comprising a high pressure pump and a plurality of V-jet nozzles;

means for collecting liquid running off a stencil mounted on said drum;

conduit means connecting said pump, nozzles and collecting means for recirculating liquid;

control means for controlling operation of said motor and said pump;

a portable cabinet containing said drum, said means for mounting said drum for rotation, and said means for directing streams of liquid; and an access door to said cabinet.

14. Apparatus as recited in claim 13 further comprising electrical heating means for heating collected liquid to an appropriate temperature above ambient.

15. Apparatus as recited in claim 13 wherein said collecting means comprises a catch basin mounted below said drum having a drain therein, and a heat insulated holding tank connected to said drain and to said conduit means.

16. Apparatus as recited in claim 15 wherein said means for mounting said drum for rotation comprises means for mounting said drum for rotation about a substantially horizontal axis so that a rotating peripheral portion of said drum is within the volume defined by said catch basin.

17. Apparatus as recited in claim 16 wherein said drain includes a drain pipe and a strainer, and wherein said pump comprises an about $\frac{1}{4}-\frac{1}{2}$ HP regenerative turbine pump capable of producing about 80 psi.

* * * * *